United States Patent
Nishizawa (10) Patent No.: US 10,751,805 B2
(45) Date of Patent: Aug. 25, 2020

(54) COATED CUTTING TOOL

(71) Applicant: TUNGALOY CORPORATION, Fukushima (JP)

(72) Inventor: Hirosato Nishizawa, Iwaki (JP)

(73) Assignee: TUNGALOY CORPORATION, Iwaki-shi, Fukushima (JP)

(*) Notice: Subject to any disclaimer, the term of this patent is extended or adjusted under 35 U.S.C. 154(b) by 170 days.

(21) Appl. No.: 16/012,835

(22) Filed: Jun. 20, 2018

(65) Prior Publication Data
US 2018/0369927 A1    Dec. 27, 2018

(30) Foreign Application Priority Data

Jun. 27, 2017   (JP) ................. 2017-124752
Jun. 4, 2018    (JP) ................. 2018-106916

(51) Int. Cl.
| | | |
|---|---|---|
| B23B 27/14 | (2006.01) | |
| C23C 14/32 | (2006.01) | |
| C23C 30/00 | (2006.01) | |
| C23C 14/00 | (2006.01) | |
| C23C 14/02 | (2006.01) | |

(Continued)

(52) U.S. Cl.
CPC ........ B23B 27/148 (2013.01); C23C 14/0021 (2013.01); C23C 14/022 (2013.01); C23C 14/0641 (2013.01); C23C 14/325 (2013.01); C23C 28/044 (2013.01); C23C 30/005 (2013.01); *B23B 2224/36* (2013.01)

(58) Field of Classification Search
USPC .......... 51/307, 309; 428/325, 336, 697, 698, 428/699
See application file for complete search history.

(56) References Cited

FOREIGN PATENT DOCUMENTS

| CN | 102650030 | * | 8/2012 |
| JP | 2012-157940 | * | 8/2012 |

(Continued)

OTHER PUBLICATIONS

Yang et al "A study of TIMoN ana-multilayer caotings deposited by CFUBMSIP using DC and HIPIMS pwer" Applied Surface Science 258 p. 2062-2067. (Year: 2012).*

(Continued)

*Primary Examiner* — Archene A Turner
(74) *Attorney, Agent, or Firm* — Studebaker & Brackett PC (57) ABSTRACT

A coated cutting tool is provided which has improved wear resistance and fracture resistance and which accordingly has a long tool life. A coated cutting tool comprising a substrate and a coating layer formed on the substrate, wherein: the coating layer comprises at least one composite compound layer containing a compound having a composition represented by $(Ti_{1-x}Mo_x)N$ (wherein x denotes an atomic ratio of the Mo element based on a total of the Ti element and the Mo element and satisfies $0.01 \leq x \leq 0.30$); a ratio $I(200)/I(111)$ between a peak intensity $I(111)$ for a (111) plane of cubic crystals of the composite compound layer and a peak intensity $I(200)$ for a (200) plane of the cubic crystals in an X-ray diffraction analysis satisfies $1 < I(200)/I(111) \leq 20$; and, as to particles which constitute the composite compound layer, an area ratio of particles each having an aspect ratio of 2 or more is 50% or higher.

20 Claims, 1 Drawing Sheet

(51) Int. Cl.
*C23C 28/04* (2006.01)
*C23C 14/06* (2006.01)

(56) References Cited

FOREIGN PATENT DOCUMENTS

| JP | 2015-037834 A | 2/2015 |
| JP | 5662680 B2 | 2/2015 |
| JP | 2017-179603 | * 10/2017 |
| WO | 2009/025112 A1 | 2/2009 |

OTHER PUBLICATIONS

Kulesohov et al "Properties of Coatings Based on Cr, Ti, and MO Nitrides with Embedded Metals Deposited on Cutting Tools." Journal of Frcition & Wear, vol. 32, No. 3 p. 192-198. (Year: 2011).*
Komiyama et al "Effect of Nitrogen Content on the Mlcostructure and Mechanical Properties of Ti-Mo-N Coating Films" Metallurgical & Materials Transactions vol. 42A p. 3310-3315. (Year: 2011).*
Komiyama et al "Effect of Heat Treatment on the Hardness of Ti-Mo-N Films Deposited by RF Reactive Sputtering". Materials Transactions, vol. 51 No. 8 p. 1467-1473. (Year: 2010).*
Kozlowski et al "Porperties of carbides, nitrides and carbonitrides based on Ti and MO multicomponents layers". Surface & Coatings Tech 98 p. 1440-1443. (Year: 1998).*

* cited by examiner

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with an increasing demand for highly efficient cutting. Thus, in terms of the characteristics required for tool materials, improvements of wear resistance and fracture resistance, which are related to the life of a cutting tool, have been becoming increasingly important. In view of this, in order to improve such characteristics, a coated cutting tool is widely used which comprises, on a surface of a substrate comprised of a cemented carbide, cermet, cBN or the like, a coating layer consisting of one layer or two or more layers which is/are each comprised of a TiN layer, a TiAlN layer or the like.

Various techniques have been proposed in order to improve the above characteristics of a coating layer. For example, Patent Document 1 proposes a surface coated cutting tool comprising a titanium compound layer containing a first compound represented by chemical formula $Ti_{1-x}M_xZ_y$ (wherein: X and Y respectively denote atomic ratios and satisfy $0<X\leq0.3$ and $0.1\leq Y\leq1$; Z denotes an element of at least one kind selected from the group consisting of boron, oxygen, carbon and nitrogen; and M denotes Cr, Nb, Mo, Hf, Ta or W and does not include Al, Si and Zr) wherein: the first compound has a crystalline structure in which a ratio B/A of a peak intensity B for a (200) plane to a peak intensity A for a (111) plane in X-ray diffraction satisfies $0\leq B/A\leq1$; and the crystal grain size is from 0.1 nm or more to 200 nm or less.

CITATION LIST

Patent Documents

Patent Document 1: JP5662680 B

SUMMARY

Technical Problem

An increase in speed, feed and depth of cut have become more conspicuous in cutting in recent times, and the wear resistance of a tool is required to be further improved compared to that involved in the prior art. In particular, there has been a growth in cutting which places a load on a coated cutting tool, such as high-speed cutting of steel. Under such severe cutting conditions, a conventional tool is likely to involve the progress of wear due to the falling of particles from a coating layer thereof. Further, when the falling of particles from a coating layer remarkably occurs, this is prone to lead to fracturing of the tool. These issues trigger a problem in that the tool life cannot be extended.

With such background, the invention disclosed in Patent Document 1 above has a problem in that insufficient wear resistance and fracture resistance result in a short tool life.

The present invention has been made in order to solve the above problems, and an object of the present invention is to provide a coated cutting tool which has improved wear resistance and fracture resistance and which accordingly has a long tool life.

Solution to Problem

The present inventor has conducted studies regarding extending the tool life of a coated cutting tool and has then found that specific configurations of a coated cutting tool allow the fracture resistance and wear resistance thereof to be improved, and found that, as a result, the tool life of the coated cutting tool can be extended, and this has led to the completion of the present invention.

Namely, the gist of the present invention is as set forth below.

[1] A coated cutting tool comprising a substrate and a coating layer formed on the substrate, wherein:

the coating layer comprises at least one composite compound layer containing a compound having a composition represented by formula (1) below:

$$(Ti_{1-x}Mo_x)N \qquad (1)$$

wherein x denotes an atomic ratio of the Mo element based on a total of the Ti element and the Mo element and satisfies $0.01 \leq x \leq 0.30$;

the composite compound layer comprises cubic crystals, and a ratio I(200)/I(111) between a peak intensity I(111) for a (111) plane of the cubic crystals and a peak intensity I(200) for a (200) plane of the cubic crystals in an X-ray diffraction analysis satisfies a condition represented by formula (A) below:

$$1.0 < I(200)/I(111) \leq 20.0 \qquad (A); \text{ and}$$

an area ratio of particles each having an aspect ratio of 2 or more is 50% or higher in particles which constitute the composite compound layer.

[2] The coated cutting tool, wherein an average particle size of the particles which constitute the composite compound layer is from 0.1 μm or more to 1.0 μm or less.

[3] The coated cutting tool, wherein an average particle size of the particles which constitute the composite compound layer is from 0.3 μm or more to 1.0 μm or less.

[4] The coated cutting tool, wherein a residual stress of the composite compound layer is a compressive residual stress.

[5] The coated cutting tool, wherein a residual stress of the composite compound layer is from −8.0 GPa or higher to −1.0 GPa or lower.

[6] The coated cutting tool, wherein an average thickness of the composite compound layer is from 1.0 μm or more to 8.0 μm or less.

[7] The coated cutting tool, wherein: the coating layer includes a lower layer between the substrate and the composite compound layer; the lower layer is a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the lower layer is from 0.1 μm or more to 3.5 μm or less.

[8] The coated cutting tool, wherein the composite compound layer is an outermost layer of the coating layer.

[9] The coated cutting tool, wherein: the coating layer includes an upper layer on the composite compound layer; the upper layer is a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

[10] The coated cutting tool, wherein an average thickness of the coating layer in its entirety is from 1.5 μm or more to 15.0 μm or less.

[11] The coated cutting tool, wherein the substrate is a cemented carbide, cermet, ceramic or a cubic boron nitride sintered body.

Advantageous Effects of Invention

The present invention can provide a coated cutting tool which has improved wear resistance and fracture resistance and which accordingly has a long tool life.

BRIEF DESCRIPTION OF DRAWINGS

The FIGURE is a schematic view showing an example of a coated cutting tool according to the present invention.

DESCRIPTION OF EMBODIMENTS

Figure 1:
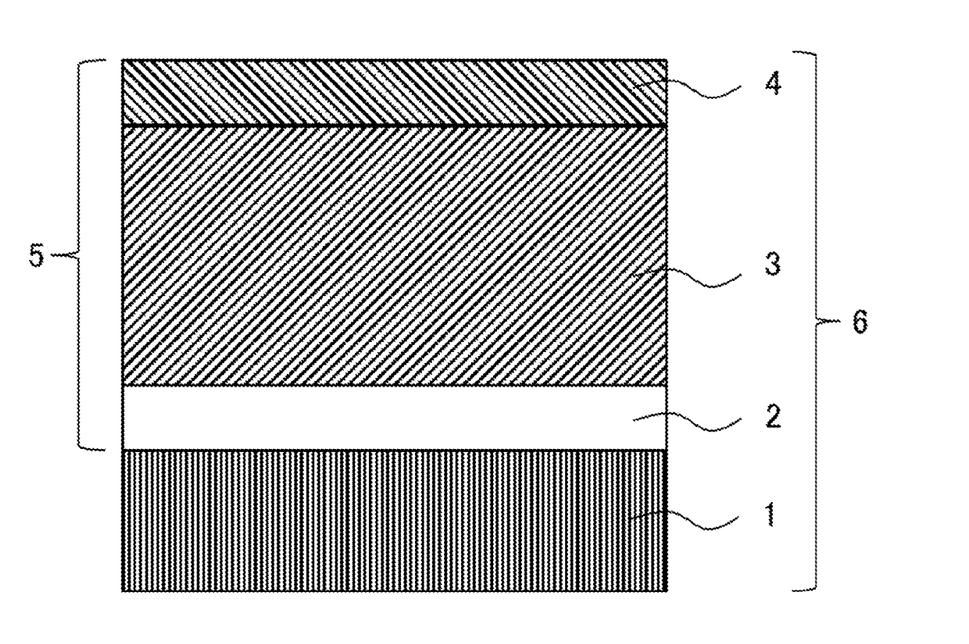

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. It should be noted that, in the drawings, the same elements are denoted by the same symbols and will not be further explained. Unless otherwise specified, positional relationships, such as vertical and horizontal relationships, are based on the positional relationships shown in the drawings. Further, the dimensional ratios of the drawings are not limited to those shown therein.

A coated cutting tool according to the present embodiment is a coated cutting tool comprising a substrate and a coating layer formed on the substrate, wherein: the coating layer comprises at least one composite compound layer containing a compound having a composition represented by formula (1) below:

$$(Ti_{1-x}Mo_x)N \quad (1)$$

[wherein x denotes an atomic ratio of the Mo element based on a total of the Ti element and the Mo element and satisfies 0.01≤x≤0.30];

the composite compound layer comprises cubic crystals, and a ratio I(200)/I(111) between a peak intensity I(111) for a (111) plane of the cubic crystals and a peak intensity I(200) for a (200) plane of the cubic crystals in an X-ray diffraction analysis satisfies a condition represented by formula (A) below:

$$1.0 < I(200)/I(111) \leq 20.0 \quad (A); \text{ and}$$

as to particles which constitute the composite compound layer, an area ratio of particles each having an aspect ratio of 2 or more is 50% or higher.

The details of the factors for the above-described coated cutting tool having improved wear resistance and fracture resistance and thereby having a long tool life have not been clarified. The present inventor considers such factors to be as set forth below; however, the factors are not limited thereto. That is, the coated cutting tool of the present embodiment comprises a coating layer including a composite compound layer containing a compound having a composition represented by formula (1) above, thereby leading to excellent toughness of the coating layer and an improvement in the fracture resistance of the coated cutting tool. Further, when the composite compound layer contains cubic crystals and also when the ratio I(200)/I(111) between the peak intensity I(111) for a (111) plane of the cubic crystals and the peak intensity I(200) for a (200) plane thereof is more than 1.0, the (111) plane exists in a more preferential manner than the (200) plane, and this allows the surface of the coating layer to be a densest plane and in turn to be hard, whereby the coated cutting tool has excellent wear resistance. Even if, in the coating layer, another layer is present on the composite compound layer, after the composite compound layer is exposed so as to be the surface through a cutting process, the coated cutting tool still has excellent wear resistance. If the ratio I(200)/I(111) is 20.0 or less, the coated cutting tool provides the operation and effects of the present embodiment in a more reliable manner. Further, when, as to the particles which constitute the composite compound layer, the area ratio of the particles each having an aspect ratio of 2 or more is 50% or higher, this indicates that the composite compound layer mainly comprises so-called elongated particles. This operation and effects provide the advantages set forth below in terms of the properties of the coating layer. Firstly, the anisotropy between the longitudinal direction of a particle and the short direction thereof affects the shear property. This results in the effect of further enhancing fracture resistance and adhesion in relation to the components of a resistance force applied onto the cutting tool. Further, the deposition structure of the particles affects the consolidation property, thereby leading to the effect of suppressing the falling of particles. As a result, the abrasion of the coating layer can be suppressed in a cutting process. Further, since particles each having a high aspect ratio indicate that crystals grow continuously and that the coating layer is therefore formed in a dense manner, this leads to an improvement of wear resistance. Given the above advantages, even if a force is applied to the coated cutting tool in a direction in which the particles of part of the composite compound layer are prone to fall off during a cutting process, such direction of the force serves as a direction in which the particles of another part of the composite compound layer are less likely to fall off, and thus, such particles which are less likely to fall off prevent the moving or falling of the particles which are prone to fall off. As a result, the coated cutting tool has excellent wear resistance. With the combination of the above effects, the coated cutting tool of the present embodiment has improved wear resistance and fracture resistance and accordingly has a long tool life.

A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of any of a cemented carbide, cermet, ceramic and a cubic boron nitride sintered body because further excellent wear resistance and fracture resistance can be provided.

The coated cutting tool of the present embodiment shows the tendency of wear resistance to be further improved if the average thickness of the entire coating layer is 1.5 μm or more. Meanwhile, such coated cutting tool shows the tendency of fracture resistance to be further improved if the average thickness of the entire coating layer is 15.0 μm or less. Thus, the average thickness of the entire coating layer is preferably from 1.5 μm or more to 15.0 μm or less. In particular, from the same perspective as that set forth above, the average thickness of the entire coating layer is more preferably from 2.0 μm or more to 10.0 μm or less.

The coating layer of the present embodiment may consist of one layer or multiple layers of two or more layers. However, at least one layer of the coating layer must include a specific layer described below (hereinafter referred to as a "composite compound layer"). The composite compound layer according to the present embodiment contains a compound having a composition represented by formula (1) below:

$$(Ti_{1-x}Mo_x)N \quad (1).$$

Thus, the coating layer has excellent toughness, thereby leading to an improvement in the fracture resistance of the coated cutting tool. In the formula above, x denotes an atomic ratio of the Mo element based on a total of the Ti element and the Mo element and satisfies $0.01 \leq x \leq 0.30$. If the atomic ratio x of the Mo element is 0.01 or more, the coating layer has excellent toughness, thereby leading to an improvement in the fracture resistance of the coated cutting tool. If the atomic ratio x is 0.30 or less, this can prevent an Mo nitride from being produced, thereby leading to excellent wear resistance of the coated cutting tool. In particular, x is further preferably from 0.05 or more to 0.30 or less.

In the present embodiment, when the composition of the composite compound layer is represented by $(Ti_{0.90}Mo_{0.10})N$, such representation indicates that the atomic ratio of the Ti element based on a total of the Ti element and the Mo element is 0.90 and that the atomic ratio of the Mo element based on a total of the Ti element and the Mo element is 0.10. That is, such representation indicates that the amount of the Ti element based on a total of the Ti element and the Mo element is 90 atom % and that the amount of the Mo element based on a total of the Ti element and the Mo element is 10 atom %.

In the present embodiment, if the average thickness of the composite compound layer is 1.0 μm or more, this allows the reduction in wear resistance to be further suppressed, and if such average thickness is 8.0 μm or less, this allows the reduction in fracture resistance to be further suppressed. Thus, the average thickness of the composite compound layer is preferably from 1.0 μm or more to 8.0 μm or less. In particular, from the same perspective as that set forth above, the average thickness of the composite compound layer is more preferably from 1.5 μm or more to 7.5 μm or less.

In the present embodiment, the composite compound layer indicates the tendency of lubricity to be excellent. Therefore, the composite compound layer preferably serves as an outermost layer because the coated cutting tool has further excellent fracture resistance.

In the present embodiment, if the average particle size of the particles which constitute the composite compound layer is 0.1 μm or more, this allows the reduction in fracture resistance to be further suppressed. Further, if such average particle size is 1.0 μm or less, this allows the reduction in fracture resistance to be further suppressed because cracking generated toward the substrate during cutting can be prevented from progressing toward the substrate. In particular, from the same perspective as that set forth above, the average particle size of the particles which constitute the composite compound layer is preferably from 0.3 μm or more to 1.0 μm or less, and is more preferably from 0.3 μm or more to 0.8 μm or less. Herein, the particle size is defined as the value of the shortest axis of the particles which constitute the composite compound layer. The respective particle sizes of the particles which constitute the composite compound layer are obtained, and the arithmetic mean is defined as an average particle size. More specifically, the average particle size of the particles is determined in accordance with each of the methods described in the examples.

In the present embodiment, if the aspect ratio of each of the particles which constitute the composite compound layer is 2 or more, this can suppress the falling of particles, thereby leading to an improvement of wear resistance. The aspect ratio refers to the value obtained by dividing the longest axis of a particle which constitutes the composite compound layer by the shortest axis thereof. An aspect ratio closer to 1 refers to a more equiaxial particle. As to the particles which constitute the composite compound layer, if the area ratio of the particles each having an aspect ratio of 2 or more is 50% or higher, the effect of suppressing the falling of particles is exerted sufficiently, thereby leading to excellent wear resistance. From the same perspective, the area ratio is more preferably 55% or higher, and is further preferably 70% or higher. It should be noted that the area ratio does not have any particular upper limit and may be 100% or lower, 95% or lower, or 90% or lower.

As to the average particle size of the particles which constitute the composite compound layer and the area ratio of the particles each having an aspect ratio of 2 or more in the present embodiment, such average particle size and such area ratio can be measured by observing a cross-sectional structure of the coated cutting tool, using an electron backscatter diffraction pattern apparatus (EBSD) attached to a scanning electron microscope (SEM), a field emission scanning electron microscope (FE-SEM) or the like. Mirror polishing is performed on the coated cutting tool in a direction orthogonal or substantially orthogonal to a surface of the substrate so as to obtain a cross-sectional structure. Examples of a method of obtaining a cross-sectional structure of the coated cutting tool include: a polishing method with the use of diamond paste or colloidal silica; and ion milling. The sample having the cross-sectional structure of the coated cutting tool is set on the FE-SEM, and the cross-sectional structure of the sample is then irradiated with an electron beam, at an angle of incidence of 70°, with an acceleration voltage of 15 kV and an irradiation current of 0.5 nA. Using the EBSD, a cross-sectional structure in the flank of the coated cutting tool is desirably measured with a measurement range of 300 μm² and a step size of 0.1 μm. At this time, a boundary with a misorientation of 5° or more is regarded as a crystal boundary, and an area surrounded by such crystal boundary is defined as referring to a particle. As to the composite compound layer, the average size of and the aspect ratio of each of the particles specified as above are obtained, whereby the average particle size and the area ratio of the particles each having an aspect ratio of 2 or more can also be obtained. Accordingly, in the present embodiment, the average particle size and the area ratio of the particles each having an aspect ratio of 2 or more are served by values obtained by means of the EBSD.

The coating layer of the present embodiment may be comprised of the composite compound layer alone. However, it is preferable for a lower layer to be provided between the substrate and the composite compound layer (i.e., located as a layer below the composite compound layer). This leads to a further improvement in adhesion between the substrate and the composite compound layer. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, Nb, Ta, Cr, Mo, W, Al, Si and Y; and an element of at least one kind selected from the group consisting of C, N, O and B, further preferably contains a compound of: an element of at least one kind selected from the group consisting of Ti, Nb, Ta, Cr, W, Al, Si and Y; and an element of at least one kind selected from the group consisting of C and N, and particularly preferably contains a compound of: an element of at least one kind selected from the group consisting of Ti, Ta, Cr, W, Al, Si and Y; and an element of at least one kind selected from the group consisting of C and N. Further, the lower layer may be comprised of a single layer or multiple layers (a laminate) of two or more layers.

In the present embodiment, the average thickness of the lower layer is preferably from 0.1 µm or more to 3.5 µm or less because this indicates the tendency of the adhesion between the substrate and the coating layer to be further improved. From the same perspective, the average thickness of the lower layer is more preferably from 0.3 µm or more to 3.0 µm or less, and is further preferably from 0.5 µm or more to 3.0 µm or less.

The coating layer of the present embodiment may have an upper layer on a side of the composite compound layer which is opposite to the substrate (i.e., located as a layer above the composite compound layer), preferably on a surface of the composite compound layer. The upper layer preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer more preferably contains a compound of: an element of at least one kind selected from the group consisting of Ti, Nb, Ta, Cr, Mo, W, Al, Si and Y; and an element of at least one kind selected from the group consisting of C, N, O and B, further preferably contains a compound of: an element of at least one kind selected from the group consisting of Ti, Nb, Ta, Cr, W, Al, Si and Y; and an element of at least one kind selected from the group consisting of C and N, and particularly preferably contains a compound of: an element of at least one kind selected from the group consisting of Ti, Nb, Cr, W, Al and Si; and an element of at least one kind selected from the group consisting of C and N. Further, the upper layer may be comprised of a single layer or multiple layers (a laminate) of two or more layers.

In the present embodiment, the average thickness of the upper layer is preferably from 0.1 µm or more to 3.5 µm or less because this indicates the tendency of wear resistance to be excellent. From the same perspective, the average thickness of the upper layer is more preferably from 0.2 µm or more to 2.0 µm or less, and is further preferably from 0.3 µm or more to 1.0 µm or less.

The composite compound layer of the coated cutting tool of the present embodiment contains cubic crystals of (Ti, Mo)N. If a ratio between a diffraction peak intensity I(111) for a (111) plane of cubic crystals and a diffraction peak intensity I(200) for a (200) plane thereof (hereinafter simply referred to as I(200)/I(111)) in an X-ray diffraction analysis is more than 1, this leads to an increased hardness, whereby the coated cutting tool has excellent wear resistance. Meanwhile, if the ratio I(200)/I(111) is 20.0 or less, the composite compound layer which provides the operation and effects of the present invention can be manufactured in a more stable manner. From such perspective, I(200)/I(111) satisfies formula (A) above, preferably satisfies formula (A1) below, and more preferably satisfies formula (A2) below.

$$1.0 < I(200)/I(111) \leq 17.5 \quad (A1)$$

$$1.0 < I(200)/I(111) \leq 15.0 \quad (A2)$$

It should be noted that ICDD Card No. 00-038-1420 shows that 2θ for a (111) plane of cubic TiN is 36.66°, and ICDD Card No. 00-025-1360 shows that 2θ for a (111) plane of cubic MoN is 37.38°. Therefore, the diffraction peak of 2θ for a (111) plane of cubic (Ti, Mo)N exists at from 36.66° or more to 37.38° or less. Further, 2θ for a (200) plane of cubic TiN is 42.60°, and 2θ for a (200) plane of cubic MoN is 43.45°. Therefore, the diffraction peak of 2θ for a (200) plane of cubic (Ti, Mo)N exists at from 42.60° or more to 43.45° or less.

As to the peak intensity of each plane index in the composite compound layer of the present embodiment, such peak intensity can be obtained using a commercially available X-ray diffractometer. For instance, when performing an X-ray diffraction measurement, with an X-ray diffractometer, RINT TTR III (product name) manufactured by Rigaku Corporation, by means of a 2θ/θ focusing optical system with Cu-Kα radiation under the following conditions, the above peak intensity of each plane index can be measured. Herein, the measurement conditions are as set forth below: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 25-70°. When obtaining the above peak intensity of each plane index from an X-ray diffraction pattern, analytic software included with the X-ray diffractometer may be used. With such analytic software, background processing and Kα2 peak removal are conducted using cubic spline, and profile fitting is conducted using Pearson-VII function, whereby each peak intensity can be obtained.

It should be noted that, when the lower layer is formed so as to be closer to the substrate than the composite compound layer, each peak intensity can be measured by a thin-film X-ray diffraction method in order to avoid the influence of the lower layer. Further, when the upper layer is formed so as to be closer to the surface than the composite compound layer, the upper layer may be removed via buffing in order to avoid the influence of the upper layer.

The residual stress of the composite compound layer of the present embodiment is preferably a compressive residual stress because this indicates the tendency of fracture resistance to be improved. In the composite compound layer of the present embodiment, the residual stress value is preferably −8.0 GPa or higher because the generation of cracking can be suppressed after the formation of the composite compound layer. Meanwhile, the residual stress value is preferably −1.0 GPa or lower because the effect of suppressing fracturing of the coated cutting tool can be further increased. Thus, the residual stress of the composite compound layer is preferably from −8.0 GPa or higher to −1.0 GPa or lower, is more preferably from −7.0 GPa or higher to −1.5 GPa or lower, and is further preferably from −6.0 GPa or higher to −1.5 GPa or lower.

The above residual stress refers to an internal stress (inherent distortion) remaining in the coating layer. In general, a stress represented by a "−" (minus) value is referred to as a compressive stress, and a stress represented by a "+"

(plus) value is referred to as a tensile stress. In the present invention, when indicating the magnitude of a residual stress, a greater "+" value means a greater residual stress, and a smaller "−" value means a smaller residual stress.

The above residual stress can be measured by a $\sin^2 \varphi$ method using an X-ray diffractometer. Such residual stress can be measured by: measuring, through the $\sin^2 \varphi$ method, the stresses at any three locations included in a portion involved in cutting (such locations are preferably selected so as to be apart from one another by 0.5 mm or more, such that the relevant stresses typify the stresses of the above portion); and obtaining the average value of such stresses.

The FIGURE is a schematic cross-sectional view showing an example of a coated cutting tool according to the present embodiment. A coated cutting tool 6 comprises a substrate 1 and a coating layer 5 formed on a surface of the substrate 1. Further, the coating layer 5 comprises: a lower layer 2 formed on the surface of the substrate 1; a composite compound layer 3 formed on a surface of the lower layer 2 which is located on a side opposite to the substrate 1; and an upper layer 4 formed on a surface of the composite compound layer 3 which is located on a side opposite to the lower layer 2.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature is from 200° C. or higher to 800° C. or lower. After the heating, an argon (Ar) gas is introduced into the reactor so that the pressure therein is from 0.5 Pa or higher to 5.0 Pa or lower. In the Ar atmosphere with a pressure of from 0.5 Pa or higher to 5.0 Pa or lower, a bias voltage of from −500 V or higher to −350 V or lower is applied to the substrate, and a current of from 40 A or higher to 50 A or lower is caused to flow through a tungsten filament in the reactor, whereby an ion bombardment process is carried out, with Ar, on a surface of the substrate. After the ion bombardment process is carried out on the substrate surface, the reactor is evacuated until the pressure therein indicates a vacuum of $1.0 \times 10^{-2}$ Pa or lower.

Then, the substrate is controlled such that the temperature is from 250° C. or higher to 500° C. or lower, a nitrogen gas ($N_2$), or $N_2$ and Ar, is/are introduced in the reactor, and the pressure in the reactor is set at from 2.0 Pa or higher to 5.0 Pa or lower. Thereafter, a bias voltage of from −120V or higher to −30V or lower is applied to the substrate, and a metal evaporation source according to the metal components of each layer is evaporated via an arc discharge with a current of from 100 A or higher to 200 A or lower, whereby the formation of a composite compound layer on the substrate surface or on the surface of the lower layer is started.

In order to make the ratio $I(200)/I(111)$ greater than 1 in the composite compound layer of the present embodiment, the temperature of the substrate may be set so as to be low in the above-described process of forming a composite compound layer. A lower temperature of the substrate indicates the tendency of the ratio $I(200)/I(111)$ to be greater. When using a metal evaporation source which has a high atomic ratio of the Mo element based on a total of the Ti element and the Mo element in the composite compound layer, this indicates the tendency of the ratio $I(200)/I(111)$ to be higher. Accordingly, the ratio $I(200)/I(111)$ can be controlled by adjusting the substrate temperature and the composition of the metal evaporation source.

In order to set a desired value for the average particle size of the particles which constitute the composite compound layer of the present embodiment, the substrate temperature may be controlled in the above-described process of forming a composite compound layer. A lower substrate temperature indicates the tendency of the average particle size of the composite compound layer to be greater. Accordingly, the average particle size can be controlled by adjusting the substrate temperature.

In order to set a desired value for the area ratio of, as to the particles which constitute the composite compound layer of the present embodiment, the particles each having an aspect ratio of 2 or more, the current may be controlled in the above-described process of forming a composite compound layer. A lower current indicates the tendency of the area ratio to be greater. Further, a lower volume ratio of $N_2$ based on a total of $N_2$ and Ar which are introduced into the reactor indicates the tendency of the aspect ratio to be greater. More specifically, comparing the case of an Ar:$N_2$ volume ratio of 0:100 and the case of an Ar:$N_2$ volume ratio of 60:40, the $N_2$ ratio is smaller in the case of 60:40, thereby leading to a greater aspect ratio. Further, a higher pressure in the reactor indicates the tendency of the aspect ratio to be greater. Accordingly, the aspect ratio can be controlled by adjusting the current, the ratio of $N_2$ introduced into the reactor and the pressure.

In order to apply a predetermined compressive stress to the composite compound layer of the present embodiment, a bias voltage to be applied to the substrate may have a greater absolute value in the above-described process of forming a composite compound layer. More specifically, comparing the case of a bias voltage of −50 V and the case of a bias voltage of −100 V, the absolute value of the bias voltage is greater in the case of −100 V, thereby leading to a greater compressive stress being applied to the composite compound layer. Accordingly, the compressive stress can be controlled by adjusting the bias voltage.

The thickness of each layer which constitutes the coating layer in the coated cutting tool of the present embodiment can be measured from a cross-sectional structure of the coated cutting tool, using an optical microscope, a scanning electron microscope (SEM), a TEM, or the like. It should be noted that, as to the average thickness of each layer in the coated cutting tool of the present embodiment, such average thickness can be obtained by: measuring the thickness of each layer, from each of the cross-sectional surfaces at three or more locations near the position 50 μm from the edge of a surface facing the metal evaporation source, toward the center of such surface; and calculating the average value (arithmetic mean) of the resulting measurements.

The composition of each layer which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

The coated cutting tool of the present embodiment provides the effect of being capable of extending the tool life compared with the prior art due to at least the point of having excellent wear resistance and fracture resistance. Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

Example 1

A machined cubic boron nitride sintered body insert with a shape of ISO standard CNGA120408 and a composition of 75.0% cBN-20.0% TiN-3.0% $Al_2O_3$-2.0% AlN (volume %) was prepared as a substrate. Further, a machined cemented carbide insert with a shape of ISO standard SEET13T3AGSN and a composition of 76.0% WC-20.0% Co-2.0% NbC-2.0% $Cr_3C_2$ (volume %) was prepared. In a reactor of an arc ion plating apparatus, a metal evaporation source was arranged so as to achieve the composition of each layer shown in each of Tables 1 and 2. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, Ar was introduced into the reactor such that the pressure therein was 2.7 Pa.

In the Ar atmosphere with a pressure of 2.7 Pa, a bias voltage of −400 V was applied to the substrate, and a current of 40 A was caused to flow through a tungsten filament in the reactor, whereby an ion bombardment process was carried out, with Ar, on a surface of the substrate for 30 minutes. After the ion bombardment process, the reactor was evacuated until the pressure therein indicated a vacuum of $5.0 \times 10^{-3}$ Pa or lower.

After the evacuation, the substrate was adjusted such that the temperature reached the temperature shown in Table 3 (temperature when the deposition was started), the gas shown in Table 3 was introduced into the reactor, and an adjustment was conducted to achieve the gas condition of the pressure shown in Table 3 in the reactor.

Thereafter, the voltage (bias voltage) shown in Table 3 was applied to the substrate, and the metal evaporation source involving the composition shown in each of Tables 1 and 2 was evaporated via the arc discharge shown in Table 3, whereby a composite compound layer (each invention sample) or a first layer (each comparative sample) was formed on the substrate surface.

After the formation of each layer with the predetermined average thickness shown in each of Tables 1 and 2 on the substrate surface, the heater was turned off, and the sample was taken out of the reactor after the temperature of the sample reached 100° C. or lower.

As to the average thickness of each layer of each of the obtained samples, such average thickness was obtained by: measuring the thickness of each layer via a SEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. The composition of each layer of the obtained sample was measured from the cross-sectional surface near the position at most 50 μm from the edge of a surface facing the metal evaporation source of the coated cutting tool, toward the center of such surface, using an EDS. The measurement results are shown in Tables 1 and 2. It should be noted that the composition ratio of the metal elements of each layer in each of Tables 1 and 2 refers to an atomic ratio of each metal element based on all the metal elements in the metal compound which constitutes each layer.

TABLE 1

| Sample No. | Coating layer | | Thickness of entire coating layer (μm) |
|---|---|---|---|
| | Composite compound layer | | |
| | Composition | Average thickness (μm) | |
| Invention sample 1 | $(Ti_{0.95}Mo_{0.05})N$ | 3.0 | 3.0 |
| Invention sample 2 | $(Ti_{0.95}Mo_{0.05})N$ | 3.0 | 3.0 |
| Invention sample 3 | $(Ti_{0.95}Mo_{0.05})N$ | 3.0 | 3.0 |
| Invention sample 4 | $(Ti_{0.95}Mo_{0.05})N$ | 3.0 | 3.0 |
| Invention sample 5 | $(Ti_{0.95}Mo_{0.05})N$ | 3.0 | 3.0 |
| Invention sample 6 | $(Ti_{0.95}Mo_{0.05})N$ | 1.5 | 1.5 |
| Invention sample 7 | $(Ti_{0.95}Mo_{0.05})N$ | 7.5 | 7.5 |
| Invention sample 8 | $(Ti_{0.85}Mo_{0.15})N$ | 3.0 | 3.0 |
| Invention sample 9 | $(Ti_{0.85}Mo_{0.15})N$ | 7.0 | 7.0 |
| Invention sample 10 | $(Ti_{0.85}Mo_{0.15})N$ | 3.0 | 3.0 |
| Invention sample 11 | $(Ti_{0.85}Mo_{0.15})N$ | 7.0 | 7.0 |
| Invention sample 12 | $(Ti_{0.85}Mo_{0.15})N$ | 3.0 | 3.0 |
| Invention sample 13 | $(Ti_{0.85}Mo_{0.15})N$ | 3.0 | 3.0 |
| Invention sample 14 | $(Ti_{0.85}Mo_{0.15})N$ | 3.0 | 3.0 |
| Invention sample 15 | $(Ti_{0.70}Mo_{0.30})N$ | 3.0 | 3.0 |
| Invention sample 16 | $(Ti_{0.70}Mo_{0.30})N$ | 3.0 | 3.0 |
| Invention sample 17 | $(Ti_{0.70}Mo_{0.30})N$ | 1.5 | 1.5 |
| Invention sample 18 | $(Ti_{0.70}Mo_{0.30})N$ | 7.5 | 7.5 |
| Invention sample 19 | $(Ti_{0.70}Mo_{0.30})N$ | 3.0 | 3.0 |
| Invention sample 20 | $(Ti_{0.70}Mo_{0.30})N$ | 3.0 | 3.0 |

TABLE 2

| Sample No. | Coating layer First layer Composition | Coating layer First layer Average thickness (μm) | Thickness of entire coating layer (μm) |
|---|---|---|---|
| Comparative sample 1 | $(Ti_{0.95}Mo_{0.05})N$ | 3.0 | 3.0 |
| Comparative sample 2 | $(Ti_{0.95}Mo_{0.05})N$ | 3.0 | 3.0 |
| Comparative sample 3 | $(Ti_{0.95}Mo_{0.05})N$ | 3.0 | 3.0 |
| Comparative sample 4 | TiN | 3.0 | 3.0 |
| Comparative sample 5 | $(Ti_{0.85}Mo_{0.15})N$ | 3.0 | 3.0 |
| Comparative sample 6 | $(Ti_{0.85}Mo_{0.15})N$ | 7.0 | 7.0 |
| Comparative sample 7 | $(Ti_{0.85}Mo_{0.15})N$ | 3.0 | 3.0 |
| Comparative sample 8 | $(Ti_{0.70}Mo_{0.30})N$ | 1.5 | 1.5 |
| Comparative sample 9 | $(Ti_{0.70}Mo_{0.30})N$ | 3.0 | 3.0 |
| Comparative sample 10 | $(Ti_{0.60}Mo_{0.40})N$ | 3.0 | 3.0 |

TABLE 3

| Sample No. | Temperature (° C.) | Pressure (Pa) | Gas condition Ar:$N_2$ | Voltage (V) | Current (A) |
|---|---|---|---|---|---|
| Invention sample 1 | 350 | 4.0 | 20:80 | −60 | 200 |
| Invention sample 2 | 340 | 5.0 | 40:60 | −60 | 150 |
| Invention sample 3 | 330 | 3.0 | 60:40 | −60 | 100 |
| Invention sample 4 | 450 | 5.0 | 40:60 | −60 | 150 |
| Invention sample 5 | 250 | 5.0 | 40:60 | −60 | 150 |
| Invention sample 6 | 350 | 4.0 | 20:80 | −60 | 200 |
| Invention sample 7 | 350 | 4.0 | 20:80 | −60 | 250 |
| Invention sample 8 | 400 | 5.0 | 40:60 | −60 | 200 |
| Invention sample 9 | 400 | 5.0 | 40:60 | −60 | 150 |
| Invention sample 10 | 300 | 3.0 | 60:40 | −60 | 100 |
| Invention sample 11 | 400 | 5.0 | 40:60 | −120 | 150 |
| Invention sample 12 | 500 | 4.0 | 20:80 | −60 | 200 |
| Invention sample 13 | 420 | 4.0 | 20:80 | −40 | 200 |
| Invention sample 14 | 300 | 3.0 | 60:40 | −30 | 100 |
| Invention sample 15 | 440 | 5.0 | 40:60 | −60 | 150 |
| Invention sample 16 | 300 | 5.0 | 40:60 | −60 | 150 |
| Invention sample 17 | 300 | 5.0 | 40:60 | −60 | 150 |
| Invention sample 18 | 300 | 5.0 | 40:60 | −60 | 150 |
| Invention sample 19 | 470 | 4.0 | 20:80 | −60 | 200 |
| Invention sample 20 | 450 | 3.0 | 40:60 | −60 | 200 |
| Comparative sample 1 | 550 | 4.0 | 20:80 | −60 | 200 |
| Comparative sample 2 | 350 | 2.0 | 20:80 | −60 | 250 |
| Comparative sample 3 | 550 | 1.5 | 0:100 | −60 | 250 |
| Comparative sample 4 | 300 | 4.0 | 60:40 | −60 | 100 |
| Comparative sample 5 | 600 | 5.0 | 40:60 | −60 | 150 |
| Comparative sample 6 | 600 | 5.0 | 40:60 | −120 | 150 |
| Comparative sample 7 | 300 | 1.5 | 20:80 | −60 | 250 |
| Comparative sample 8 | 650 | 1.5 | 20:80 | −60 | 250 |
| Comparative sample 9 | 300 | 1.5 | 20:80 | −140 | 250 |
| Comparative sample 10 | 520 | 5.0 | 40:60 | −60 | 150 |

As to the particles each having an aspect ratio of 2 or more in the obtained sample, the area ratio and the average particle size were measured using an EBSD attached to an FE-SEM. More specifically, the coated cutting tool was polished using diamond paste and then subjected to finishing polishing with the use of colloidal silica, thereby obtaining a cross-sectional structure of the coated cutting tool. The sample having the cross-sectional structure of the coated cutting tool was set on the FE-SEM, and the cross-sectional structure of the sample was then irradiated with an electron beam, at an angle of incidence of 70°, with an acceleration voltage of 15 kV and an irradiation current of 0.5 nA. Using the EBSD, a cross-sectional structure in the flank of the coated cutting tool was measured with a measurement range of 300 μm² and a step size of 0.1 μm. At this time, a boundary with a misorientation of 5° or more was regarded as a crystal boundary, and an area surrounded by such crystal boundary was defined as referring to a particle. As to the composite compound layer, the average particle size of the specified particles and the area ratio of the particles each having an aspect ratio of 2 or more were obtained. The results are shown in Tables 4 and 5. As to comparative sample 4, the average particle size of the TiN layer and the area ratio of the particles each having an aspect ratio of 2 or more were obtained.

TABLE 4

| Sample No. | Composite compound layer Area ratio of particles each having an aspect ratio of 2 or more (area %) | Composite compound layer Average particle size (μm) |
|---|---|---|
| Invention sample 1 | 55 | 0.5 |
| Invention sample 2 | 70 | 0.5 |
| Invention sample 3 | 90 | 0.5 |
| Invention sample 4 | 70 | 0.5 |
| Invention sample 5 | 70 | 0.5 |
| Invention sample 6 | 55 | 0.5 |
| Invention sample 7 | 55 | 0.5 |

TABLE 4-continued

| Sample No. | Composite compound layer Area ratio of particles each having an aspect ratio of 2 or more (area %) | Average particle size (μm) |
|---|---|---|
| Invention sample 8 | 70 | 0.5 |
| Invention sample 9 | 70 | 0.5 |
| Invention sample 10 | 90 | 1.0 |
| Invention sample 11 | 70 | 0.5 |
| Invention sample 12 | 55 | 0.1 |
| Invention sample 13 | 55 | 0.3 |
| Invention sample 14 | 90 | 1.0 |
| Invention sample 15 | 70 | 0.5 |
| Invention sample 16 | 70 | 0.8 |
| Invention sample 17 | 70 | 0.8 |
| Invention sample 18 | 70 | 0.8 |
| Invention sample 19 | 55 | 0.3 |
| Invention sample 20 | 60 | 1.0 |

TABLE 5

| Sample No. | First layer Area ratio of particles each having an aspect ratio of 2 or more (area %) | Average particle size (μm) |
|---|---|---|
| Comparative sample 1 | 55 | 0.5 |
| Comparative sample 2 | 25 | 0.5 |
| Comparative sample 3 | 15 | 0.5 |
| Comparative sample 4 | 95 | 0.5 |
| Comparative sample 5 | 70 | 0.5 |
| Comparative sample 6 | 70 | 0.5 |
| Comparative sample 7 | 20 | 1.0 |
| Comparative sample 8 | 20 | 0.5 |
| Comparative sample 9 | 20 | 0.5 |
| Comparative sample 10 | 70 | 0.5 |

As to the obtained samples, X-ray diffraction by means of a 2θ/θ focusing optical system with Cu-Kα radiation was measured under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 25°-70°. As to the apparatus, an X-ray diffractometer "RINT TTR lll" (product name) manufactured by Rigaku Corporation was used. The peak intensity of each plane index of the composite compound layer or the first layer was obtained from an X-ray diffraction pattern. I(200)/I(111) was obtained from the resulting peak intensity of each plane index. The results are shown in Tables 6 and 7.

TABLE 6

| Sample No. | Composite compound layer I(200)/I(111) |
|---|---|
| Invention sample 1 | 2.0 |
| Invention sample 2 | 2.0 |
| Invention sample 3 | 2.0 |
| Invention sample 4 | 1.1 |
| Invention sample 5 | 5.0 |
| Invention sample 6 | 2.0 |
| Invention sample 7 | 2.0 |
| Invention sample 8 | 2.0 |
| Invention sample 9 | 2.0 |
| Invention sample 10 | 5.0 |
| Invention sample 11 | 2.0 |
| Invention sample 12 | 1.1 |
| Invention sample 13 | 1.8 |
| Invention sample 14 | 5.0 |
| Invention sample 15 | 2.0 |
| Invention sample 16 | 12.0 |
| Invention sample 17 | 12.0 |
| Invention sample 18 | 12.0 |
| Invention sample 19 | 1.8 |
| Invention sample 20 | 2.0 |

TABLE 7

| Sample No. | First layer I(200)/I(111) |
|---|---|
| Comparative sample 1 | 0.3 |
| Comparative sample 2 | 2.0 |
| Comparative sample 3 | 0.3 |
| Comparative sample 4 | 2.0 |
| Comparative sample 5 | 0.5 |
| Comparative sample 6 | 0.5 |
| Comparative sample 7 | 5.0 |
| Comparative sample 8 | 0.7 |
| Comparative sample 9 | 12.0 |

TABLE 7-continued

| Sample No. | First layer I(200)/I(111) |
|---|---|
| Comparative sample 10 | 2.0 |

As to the obtained samples, the compressive stress of the composite compound layer or the first layer was measured by a $\sin^2 \varphi$ method using an X-ray diffractometer. Such compressive stress of the composite compound layer or the first layer was obtained by: measuring the stresses at any three locations included in a portion involved in cutting; and calculating the average value (arithmetic mean) of the resulting measurements. As to comparative sample 4, the residual stress of the TiN layer was obtained. The results are shown in Tables 8 and 9.

TABLE 8

| Sample No. | Composite compound layer Residual stress (GPa) |
|---|---|
| Invention sample 1 | −2.1 |
| Invention sample 2 | −2.1 |
| Invention sample 3 | −2.1 |
| Invention sample 4 | −2.1 |
| Invention sample 5 | −2.1 |
| Invention sample 6 | −2.1 |
| Invention sample 7 | −2.1 |
| Invention sample 8 | −2.1 |
| Invention sample 9 | −2.1 |
| Invention sample 10 | −2.1 |
| Invention sample 11 | −6.4 |
| Invention sample 12 | −2.1 |
| Invention sample 13 | −1.2 |
| Invention sample 14 | −0.5 |
| Invention sample 15 | −2.1 |
| Invention sample 16 | −2.1 |
| Invention sample 17 | −2.1 |
| Invention sample 18 | −2.1 |
| Invention sample 19 | −2.1 |
| Invention sample 20 | −2.1 |

TABLE 9

| Sample No. | First layer Residual stress (GPa) |
|---|---|
| Comparative sample 1 | −2.1 |
| Comparative sample 2 | −2.1 |
| Comparative sample 3 | −2.1 |
| Comparative sample 4 | −2.1 |
| Comparative sample 5 | −2.1 |
| Comparative sample 6 | −6.4 |
| Comparative sample 7 | −2.1 |
| Comparative sample 8 | −2.1 |
| Comparative sample 9 | −8.8 |
| Comparative sample 10 | −2.1 |

Using the obtained samples, the following cutting tests were conducted.

[Cutting Test 1]
Insert shape: CNGA120408
Workpiece: SCM415H
Workpiece shape: Cylinder of φ150 mm×300 mm
Cutting speed: 130 m/min
Feed: 0.15 mm/rev
Depth of cut: 0.15 mm
Coolant: Used
Evaluation items: A time when a sample was fractured (chipping occurred in the cutting edge of a sample) or had a corner-cutting-edge wear width of 0.15 mm was defined as the end of the tool life, and the machining length to reach the end of the tool life was measured.

[Cutting Test 2]
Insert shape: SEET13T3AGSN
Workpiece: SUS304
Workpiece shape: Rectangular parallelepiped of 300 mm×120 mm×60 mm
Cutting speed: 110 m/min
Feed: 0.15 mm/tooth
Depth of cut: 2.0 mm
Coolant: Not used
Width of cut: 60 mm
Evaluation items: A time when a sample was fractured (chipping occurred in the cutting edge of a sample) or had a flank wear width of 0.20 mm was defined as the end of the tool life, and the machining time to reach the end of the tool life was measured.

TABLE 10

| | Cutting test 1 | | Cutting test 2 | |
|---|---|---|---|---|
| Sample No. | Machining length (m) | Damage form | Machining time (min) | Damage form |
| Invention sample 1 | 4.9 | Normal wear | 43 | Normal wear |
| Invention sample 2 | 5.1 | Normal wear | 47 | Normal wear |
| Invention sample 3 | 5.2 | Normal wear | 49 | Normal wear |
| Invention sample 4 | 4.7 | Normal wear | 40 | Normal wear |

TABLE 10-continued

| | Cutting test 1 | | Cutting test 2 | |
|---|---|---|---|---|
| Sample No. | Machining length (m) | Damage form | Machining time (min) | Damage form |
| Invention sample 5 | 5.5 | Normal wear | 51 | Normal wear |
| Invention sample 6 | 4.7 | Normal wear | 39 | Normal wear |
| Invention sample 7 | 5.4 | Normal wear | 49 | Normal wear |
| Invention sample 8 | 5.3 | Normal wear | 48 | Normal wear |
| Invention sample 9 | 5.6 | Normal wear | 51 | Normal wear |
| Invention sample 10 | 6.1 | Normal wear | 46 | Normal wear |
| Invention sample 11 | 5.9 | Normal wear | 54 | Normal wear |
| Invention sample 12 | 4.5 | Normal wear | 40 | Normal wear |
| Invention sample 13 | 5.0 | Normal wear | 45 | Normal wear |
| Invention sample 14 | 5.5 | Normal wear | 50 | Normal wear |
| Invention sample 15 | 4.8 | Normal wear | 42 | Normal wear |
| Invention sample 16 | 5.5 | Normal wear | 52 | Normal wear |
| Invention sample 17 | 5.0 | Normal wear | 46 | Normal wear |
| Invention sample 18 | 6.0 | Normal wear | 55 | Normal wear |
| Invention sample 19 | 4.6 | Normal wear | 40 | Normal wear |
| Invention sample 20 | 5.0 | Normal wear | 46 | Normal wear |

TABLE 11

| | Cutting test 1 | | Cutting test 2 | |
|---|---|---|---|---|
| Sample No. | Machining length (m) | Damage form | Machining time (min) | Damage form |
| Comparative sample 1 | 3.2 | Fracturing | 24 | Fracturing |
| Comparative sample 2 | 3.9 | Fracturing | 31 | Fracturing |
| Comparative sample 3 | 2.7 | Fracturing | 19 | Fracturing |
| Comparative sample 4 | 2.4 | Fracturing | 17 | Fracturing |
| Comparative sample 5 | 3.5 | Fracturing | 27 | Fracturing |
| Comparative sample 6 | 3.0 | Fracturing | 20 | Fracturing |
| Comparative sample 7 | 4.1 | Fracturing | 30 | Fracturing |
| Comparative sample 8 | 2.2 | Fracturing | 18 | Fracturing |
| Comparative sample 9 | 2.9 | Fracturing | 16 | Fracturing |
| Comparative sample 10 | 2.5 | Fracturing | 18 | Fracturing |

As to cutting test 1, the machining length of each invention sample was 4.5 m or more, which was longer than the machining length of each comparative sample. Further, the damage form of each invention sample was normal wear, whereas the damage form of each comparative sample was fracturing.

As to cutting test 2, the machining time of each invention sample was 39 minutes or longer, which was longer than the machining time of each comparative sample. Further, the damage form of each invention sample was normal wear, whereas the damage form of each comparative sample was fracturing.

The above results indicate that each invention sample has improved wear resistance and fracture resistance and accordingly has a long tool life.

Example 2

A machined cubic boron nitride sintered body insert with a shape of ISO standard CNGA120408 and a composition of 75.0% cBN-20.0% TiN-3.0% $Al_2O_3$-2.0% AlN (volume %) was prepared as a substrate. Further, a machined cemented carbide insert with a shape of ISO standard SEET13T3AGSN and a composition of 76.0% WC-20.0% Co-2.0% NbC-2.0% $Cr_3C_2$ (volume %) was prepared. Samples were manufactured, as set forth below, each of which comprises a coating layer including: the composite compound layer of any of invention samples 2, 6, 11, 16 and 18 of Example 1; and a lower layer and an upper layer formed so as to sandwich the composite compound layer. Firstly, in a reactor of an arc ion plating apparatus, a metal evaporation source was arranged so as to achieve the composition of each layer shown in Table 12. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, Ar was introduced into the reactor such that the pressure therein became 2.7 Pa.

In the Ar atmosphere with a pressure of 2.7 Pa, a bias voltage of −400 V was applied to the substrate, and a current of 40 A was caused to flow through a tungsten filament in the reactor, whereby an ion bombardment process was carried out, with Ar, on a surface of the substrate for 30 minutes. After the ion bombardment process, the reactor was evacuated until the pressure therein indicated a vacuum of $5.0 \times 10^{-3}$ Pa or lower.

As to invention samples 21, 22, 24 to 29 and 31 to 34, after the evacuation, $N_2$ was introduced into the reactor such that the pressure therein reached 3.0 Pa. Thereafter, a bias voltage of −50 V was applied to the substrate, and the metal evaporation source involving the composition shown in Table 12 was evaporated via an arc discharge with an arc current of 120 A, whereby the lower layer was formed.

As to invention sample 30, after the evacuation, Ar, $N_2$ and an acetylene gas ($C_2H_2$) were introduced into the reactor such that the pressure therein reached 3.0 Pa. At this time, Ar, $N_2$ and $C_2H_2$ were introduced at a volume ratio of Ar:$N_2$:$C_2H_2$=45:45:10. Thereafter, a bias voltage of −50 V was applied to the substrate, and the metal evaporation source involving the composition shown in Table 12 was evaporated via an arc discharge with an arc current of 120 A, whereby the lower layer was formed.

After the formation of the lower layer, the composite compound layer shown in Table 12 was formed on the surface of the lower layer under the same conditions as those for the invention samples in Example 1. As to invention sample 23, without the formation of the lower layer, the composite compound layer shown in Table 12 was formed on the substrate surface under the same conditions as those for invention sample 2 in Example 1.

As to invention samples 22 to 24, 26, 27, 29 to 32 and 34, after the formation of the composite compound layer, $N_2$ was introduced into the reactor such that the pressure therein reached 3.0 Pa. A bias voltage of −50 V was applied to the substrate, and the metal evaporation source involving the composition shown in Table 12 was evaporated via an arc discharge with an arc current of 120 A, whereby the upper layer was formed.

source of the coated cutting tool, toward the center thereof, using an EDS. The measurement results are shown in Table 12. It should be noted that the composition ratio of the metal elements of each layer in Table 12 refers to an atomic ratio of each metal element based on all the metal elements in the metal compound which constitutes each layer.

TABLE 12

| | Coating layer | | | | | | |
|---|---|---|---|---|---|---|---|
| | Lower layer | | Composite compound layer | | Upper layer | | Average thickness |
| Sample No. | Composition | Average thickness (μm) | Sample No. | Average thickness (μm) | Composition | Average thickness (μm) | of entire coating layer (μm) |
| Invention sample 21 | $(Ti_{0.40}Al_{0.60})N$ | 0.5 | Invention sample 2 | 3.0 | — | — | 3.5 |
| Invention sample 22 | $(Ti_{0.60}Al_{0.40})N$ | 1.0 | Invention sample 2 | 3.0 | $(Ti_{0.50}Al_{0.50})N$ | 0.3 | 4.3 |
| Invention sample 23 | — | — | Invention sample 2 | 3.0 | $(Ti_{0.50}Al_{0.30}Cr_{0.15}Si_{0.05})N$ | 3.0 | 6.0 |
| Invention sample 24 | TiN | 2.0 | Invention sample 6 | 1.5 | AlN | 1.0 | 4.5 |
| Invention sample 25 | $(Ti_{0.90}W_{0.10})N$ | 3.0 | Invention sample 6 | 1.5 | — | — | 4.5 |
| Invention sample 26 | $(Ti_{0.50}Al_{0.30}Cr_{0.15}Si_{0.05})N$ | 0.5 | Invention sample 6 | 1.5 | $(Ti_{0.50}Al_{0.40}Si_{0.10})N$ | 2.5 | 4.5 |
| Invention sample 27 | $(Ti_{0.70}Al_{0.20}W_{0.10})N$ | 0.5 | Invention sample 11 | 7.0 | $(Ti_{0.80}Nb_{0.20})N$ | 1.5 | 9.0 |
| Invention sample 28 | $(Ti_{0.60}Al_{0.35}Y_{0.05})N$ | 1.0 | Invention sample 11 | 7.0 | TiCN | 1.0 | 9.0 |
| Invention sample 29 | AlN | 2.0 | Invention sample 11 | 7.0 | $(Ti_{0.90}Nb_{0.10})N$ | 0.3 | 9.3 |
| Invention sample 30 | TiCN | 1.0 | Invention sample 16 | 3.0 | $(Ti_{0.40}Al_{0.40}Nb_{0.10})N$ | 1.0 | 5.0 |
| Invention sample 31 | $(Ti_{0.50}Al_{0.50})N$ | 1.0 | Invention sample 16 | 3.0 | TiN | 1.0 | 5.0 |
| Invention sample 32 | $(Ti_{0.50}Al_{0.40}Si_{0.10})N$ | 0.5 | Invention sample 16 | 3.0 | $(Ti_{0.90}W_{0.10})N$ | 0.5 | 4.0 |
| Invention sample 33 | $(Ti_{0.90}W_{0.10})N$ | 1.0 | Invention sample 18 | 7.5 | — | — | 8.5 |
| Invention sample 34 | $(Ti_{0.50}Al_{0.40}Ta_{0.10})N$ | 0.5 | Invention sample 18 | 7.5 | $(Ti_{0.60}Al_{0.40})N$ | 0.5 | 8.5 |

*Each "—" symbol in either the "composition" or "average thickness" column indicates that either a lower layer or an upper layer is not formed.

As to invention sample 28, after the formation of the composite compound layer, Ar, $N_2$ and $C_2H_2$ were introduced into the reactor such that the pressure therein reached 3.0 Pa. At this time, Ar, $N_2$ and $C_2H_2$ were introduced at a volume ratio of Ar:$N_2$:$C_2H_2$=45:45:10. A bias voltage of −50 V was applied to the substrate, and the metal evaporation source involving the composition shown in Table 12 was evaporated via an arc discharge with an arc current of 120 A, whereby the upper layer was formed.

After the formation of each layer with the predetermined thickness shown in Table 12 on the substrate surface, the heater was turned off, and the sample was taken out of the reactor after the temperature of the sample reached 100° C. or lower.

As to the average thickness of each layer of each of the obtained samples, such average thickness was obtained by: measuring the thickness of each layer via a SEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. The composition of each layer of the obtained sample was measured from the cross-sectional surface near the position at most 50 μm from the edge of a surface facing the metal evaporation Using the obtained samples, cutting tests were conducted in the same way as Example 1. The results are shown in Table 13.

TABLE 13

| | Cutting test 1 | | Cutting test 2 | |
|---|---|---|---|---|
| Sample No. | Machining length (m) | Damage form | Machining time (min) | Damage form |
| Invention sample 21 | 5.3 | Normal wear | 49 | Normal wear |
| Invention sample 22 | 5.7 | Normal wear | 51 | Normal wear |
| Invention sample 23 | 5.9 | Normal wear | 54 | Normal wear |
| Invention sample 24 | 5.3 | Normal wear | 45 | Normal wear |
| Invention sample 25 | 5.8 | Normal wear | 47 | Normal wear |
| Invention sample 26 | 5.4 | Normal wear | 44 | Normal wear |
| Invention sample 27 | 6.5 | Normal wear | 59 | Normal wear |
| Invention sample 28 | 6.6 | Normal wear | 59 | Normal wear |

TABLE 13-continued

| | Cutting test 1 | | Cutting test 2 | |
|---|---|---|---|---|
| Sample No. | Machining length (m) | Damage form | Machining time (min) | Damage form |
| Invention sample 29 | 6.3 | Normal wear | 60 | Normal wear |
| Invention sample 30 | 5.9 | Normal wear | 59 | Normal wear |
| Invention sample 31 | 5.9 | Normal wear | 58 | Normal wear |
| Invention sample 32 | 6.0 | Normal wear | 56 | Normal wear |
| Invention sample 33 | 6.6 | Normal wear | 60 | Normal wear |
| Invention sample 34 | 6.3 | Normal wear | 58 | Normal wear |

The results of Table 13 indicate that the machining length and the machining time of each of invention samples 21 to 34 is slightly longer than the machining length and the machining time of each of the invention samples each comprising a coating layer which only comprises the composite compound layer included in the coating layer of the relevant one of invention samples 21 to 34. Therefore, it is apparent that the invention samples each provide the effect of the present invention even if they each include the lower layer and the upper layer.

INDUSTRIAL APPLICABILITY

The coated cutting tool of the present invention involves an extended tool life compared with the prior art and therefore has high industrial applicability with regard to such usage.

REFERENCE SIGNS LIST

1: Substrate, 2: Lower layer, 3: Composite compound layer, 4: Upper layer, 5: Coating layer, 6: Coated cutting tool.

What is claimed is:

1. A coated cutting tool comprising a substrate and a coating layer formed on the substrate, wherein:
the coating layer comprises at least one composite compound layer containing a compound having a composition represented by formula (1) below:

$(Ti_{1-x}Mo_x)N$     (1)

wherein x denotes an atomic ratio of the Mo element based on a total of the Ti element and the Mo element and satisfies $0.01 \leq x \leq 0.30$;
the composite compound layer comprises cubic crystals, and a ratio $I(200)/I(111)$ between a peak intensity $I(111)$ for a (111) plane of the cubic crystals and a peak intensity $I(200)$ for a (200) plane of the cubic crystals in an X-ray diffraction analysis satisfies a condition represented by formula (A) below:

$1.0 < I(200)/I(111) \leq 20.0$     (A); and an area ratio of 50% or more of the composite compound layer is constituted by particles that have an aspect ratio of 2 or more.

2. The coated cutting tool according to claim 1, wherein an average particle size of the particles which constitute the composite compound layer is from 0.1 µm or more to 1.0 µm or less.

3. The coated cutting tool according to claim 1, wherein an average particle size of the particles which constitute the composite compound layer is from 0.3 µm or more to 1.0 µm or less.

4. The coated cutting tool according to claim 1, wherein a residual stress of the composite compound layer is a compressive residual stress.

5. The coated cutting tool according to claim 1, wherein a residual stress of the composite compound layer is from −8.0 GPa or higher to −1.0 GPa or lower.

6. The coated cutting tool according to claim 1, wherein an average thickness of the composite compound layer is from 1.0 µm or more to 8.0 µm or less.

7. The coated cutting tool according to claim 1, wherein:
the coating layer includes a lower layer between the substrate and the composite compound layer;
the lower layer is a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 µm or more to 3.5 µm or less.

8. The coated cutting tool according to claim 1, wherein the composite compound layer is an outermost layer of the coating layer.

9. The coated cutting tool according to claim 1, wherein:
the coating layer includes an upper layer on the composite compound layer;
the upper layer is a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 µm or more to 3.5 µm or less.

10. The coated cutting tool according to claim 1, wherein an average thickness of the coating layer in its entirety is from 1.5 µm or more to 15.0 µm or less.

11. The coated cutting tool according to claim 1, wherein the substrate is a cemented carbide, cermet, ceramic or a cubic boron nitride sintered body.

12. The coated cutting tool according to claim 2, wherein a residual stress of the composite compound layer is a compressive residual stress.

13. The coated cutting tool according to claim 3, wherein a residual stress of the composite compound layer is a compressive residual stress.

14. The coated cutting tool according to claim 2, wherein a residual stress of the composite compound layer is from −8.0 GPa or higher to −1.0 GPa or lower.

15. The coated cutting tool according to claim 3, wherein a residual stress of the composite compound layer is from −8.0 GPa or higher to −1.0 GPa or lower.

16. The coated cutting tool according to claim 4, wherein a residual stress of the composite compound layer is from −8.0 GPa or higher to −1.0 GPa or lower.

17. The coated cutting tool according to claim 12, wherein a residual stress of the composite compound layer is from −8.0 GPa or higher to −1.0 GPa or lower.

18. The coated cutting tool according to claim 13, wherein a residual stress of the composite compound layer is from −8.0 GPa or higher to −1.0 GPa or lower.

19. The coated cutting tool according to claim 2, wherein an average thickness of the composite compound layer is from 1.0 μm or more to 8.0 μm or less.

20. The coated cutting tool according to claim 3, wherein an average thickness of the composite compound layer is from 1.0 μm or more to 8.0 μm or less.

\* \* \* \* \*